United States Patent
Harada et al.

(10) Patent No.: US 10,715,097 B2
(45) Date of Patent: Jul. 14, 2020

(54) MULTIPLEXER AND COMMUNICATION APPARATUS

(71) Applicant: Murata Manufacturing Co., Ltd., Nagaokakyo-shi, Kyoto-fu (JP)

(72) Inventors: Shun Harada, Nagaokakyo (JP); Yukiya Yamaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/274,276

(22) Filed: Feb. 13, 2019

(65) Prior Publication Data

US 2019/0280668 A1  Sep. 12, 2019

(30) Foreign Application Priority Data

Mar. 8, 2018 (JP) ................................ 2018-042108

(51) Int. Cl.
| | |
|---|---|
| *H03H 7/46* | (2006.01) |
| *H04B 1/00* | (2006.01) |
| *H03H 9/72* | (2006.01) |
| *H04L 25/03* | (2006.01) |

(52) U.S. Cl.
CPC ............ *H03H 7/461* (2013.01); *H03H 7/466* (2013.01); *H03H 9/72* (2013.01); *H04B 1/0057* (2013.01); *H04L 25/03006* (2013.01); *H04L 2025/03375* (2013.01)

(58) Field of Classification Search
CPC .......... H03H 7/461; H03H 7/466; H03H 9/72; H04B 1/0057; H04L 25/03006; H04L 2025/03375
USPC ...................................................... 333/132
See application file for complete search history.

(56) References Cited

U.S. PATENT DOCUMENTS

2007/0222540 A1 * 9/2007 Nishigaki ............ H03H 9/0571
                                                         333/133
2012/0235767 A1   9/2012 Takata et al.

FOREIGN PATENT DOCUMENTS

| JP | 2008-205893 A | 9/2008 |
|---|---|---|
| WO | 2011/077773 A1 | 6/2011 |

* cited by examiner

*Primary Examiner* — Robert J Pascal
*Assistant Examiner* — Kimberly E Glenn
(74) *Attorney, Agent, or Firm* — Keating & Bennett, LLP

(57) ABSTRACT

A multiplexer includes a first filter disposed on a first signal path, a second filter disposed on a second signal path different from the first signal path, the second filter having a passband different from that of the first filter, a common connection point at which the first signal path and the second signal path are connected to each other, and an inductor disposed in series on a path connecting the common connection point and the first filter, the path being a portion of the first signal path. On the first signal path, a distance connecting the common connection point and the inductor is shorter than a distance connecting the inductor and the first filter.

20 Claims, 12 Drawing Sheets

MULTIPLEXER AND COMMUNICATION APPARATUS

CROSS REFERENCE TO RELATED APPLICATIONS

This application claims the benefit of priority to Japanese Patent Application No. 2018-042108 filed on Mar. 8, 2018. The entire contents of this application are hereby incorporated herein by reference.

BACKGROUND OF THE INVENTION

1. Field of the Invention

The present invention relates to a multiplexer including a plurality of filters, and a communication apparatus.

2. Description of the Related Art

In recent years, a multiplexer for isolating (demultiplexing) a radio-frequency (RF) signal in units of frequency bands in order to function with a plurality of frequency bands and a plurality of wireless systems, namely, multi-bands and multi-modes, using one terminal has been widely used in communication apparatuses, such as cellular phone terminals. As this type of multiplexer, International Publication No. WO 2011/077773 discloses a multiplexer including a plurality of filters. In this multiplexer, wiring lines extracted from the individual filters are connected at a common connection point, and are connected to an antenna-side common terminal.

In the above-described multiplexer, a signal path from the common connection point to each filter is configured to be short in order to suppress deterioration of the characteristics of the multiplexer.

In order to suppress an increase in an insertion loss in the passband of each filter, the multiplexer is demanded to increase, for each filter viewed from the common connection point, impedance in a partner band while matching impedance in each filter's band. In order to meet these demands, for example, a configuration is conceivable in which an inductor which is a phase adjustment element is arranged in series between the common connection point and a certain filter among the plurality of filters.

However, if the inductor is located between the common connection point and the certain filter, a signal path from the common connection point to the certain filter is not short, which in turn may deteriorate the characteristics of the multiplexer.

SUMMARY OF THE INVENTION

Preferred embodiments of the present invention reduce or prevent deterioration of the characteristics of multiplexers each including an inductor defining a phase adjustment element.

According to a preferred embodiment of the present invention, a multiplexer includes a first filter disposed on a first signal path; a second filter disposed on a second signal path different from the first signal path, the second filter including a passband different from that of the first filter; a common connection point at which the first signal path and the second signal path are connected to each other; and an inductor disposed in series on a path connecting the common connection point and the first filter, the path being a portion of the first signal path. On the first signal path, a distance connecting the common connection point and the inductor is shorter than a distance connecting the inductor and the first filter.

In this manner, the amount of attenuation in the passband of the second filter, which defines and functions as a partner band of the first filter, may be increased by making, on the first signal path, a distance connecting the common connection point and the inductor shorter than a distance connecting the inductor and the first filter. Accordingly, an increase in an insertion loss in the passband of the second filter is able to be reduced or prevented, thus reducing or preventing deterioration of the characteristics of the multiplexer.

On the first signal path, the common connection point and the inductor may be connected by a first wiring line, and the inductor and the first filter may be connected by a second wiring line. A length of the first wiring line may be shorter than a length of the second wiring line.

In this manner, on the first signal path, the first wiring line connecting the common connection point and the inductor is shorter than the second wiring line connecting the inductor and the first filter, thus reducing a stray capacitance generated by the first wiring line. Accordingly, because the amount of attenuation in the passband of the second filter, which defines and functions as a partner band of the first filter, may be increased, an increase in an insertion loss in the passband of the second filter is able to be reduced or prevented, and deterioration of the characteristics of the multiplexer is able to be reduced or prevented.

The inductor may include a substantially coil-shaped conductor.

Accordingly, the inductor including a substantially coil-shaped conductor has a greater inductance than other inductors. Thus, it is possible to secure a large range in which the phase is adjusted by the inductor, and accordingly, phase adjustment is able to be performed as intended.

In addition, a distance connecting the common connection point and the first filter on the first signal path may be longer than a distance connecting the common connection point and the second filter on the second signal path.

Accordingly, even in the case in which there is a design restriction such that the distance of the first signal path is longer, deterioration of the characteristics of the multiplexer is able to be reduced or prevented by making, on the first signal path, the distance connecting the common connection point and the inductor shorter than the distance connecting the inductor and the first filter.

In addition, the first filter may have a passband lower than that of the second filter.

Accordingly, the occurrence of higher-mode spurious emission caused by a stray capacitance generated on a path between the common connection point and the inductor is able to be reduced or prevented in the passband of the second filter whose passband is higher than that of the first filter, thus reducing or preventing an increase in the insertion loss.

In addition, the multiplexer may further include a third filter disposed on a third signal path different from each of the first signal path and the second signal path. The third signal path may be connected to the common connection point, and the third filter may have a passband higher than that of the first filter.

Accordingly, because the amount of attenuation in the passband of the third filter, which defines and functions as a partner band of the first filter, may be increased, an increase in an insertion loss in the passband of the third filter is able to be reduced or prevented, and deterioration of the characteristics of the multiplexer is able to be reduced or prevented.

Each of the first filter, the second filter, and the third filter may be a reception filter. The passband of the first filter may be Band 3 of the 3rd Generation Partnership Project (3GPP), the passband of the second filter may be Band 1 of 3GPP, and the passband of the third filter may be Band 40 of 3GPP.

Accordingly, deterioration of the characteristics of the multiplexer including Band 3, Band 1, and Band 40 is able to be reduced or prevented.

In addition, the multiplexer may further include a switch including a switch common terminal and a plurality of selection terminals; and a fourth filter connected to a first selection terminal among the plurality of selection terminals, the fourth filter having a passband different from that of the first filter and the second filter. The common connection point may be connected to a second selection terminal different from the first selection terminal among the plurality of selection terminals.

Accordingly, because the amount of attenuation in the passband of the fourth filter, which defines and functions as a partner band of the first filter, may be increased, an increase in an insertion loss in the passband of the fourth filter is able to be reduced or prevented, and deterioration of the characteristics of the multiplexer is able to be reduced or prevented.

In addition, the switch may include one or more switch elements that simultaneously connect the switch common terminal and the first selection terminal, and the switch common terminal and the second selection terminal.

Accordingly, signals in a plurality of passbands may be wirelessly communicated at the same time using the multiplexer.

In addition, the passband of the fourth filter may be Band 7 of 3GPP.

Accordingly, deterioration of the characteristics of the multiplexer including Band 7 is able to be reduced or prevented.

According to a preferred embodiment of the present invention, a communication apparatus includes a multiplexer described above and a signal processing circuit.

Accordingly, because the communication apparatus includes a multiplexer whose characteristics are reduced or prevented from being deteriorated, the communication apparatus with an improved communication quality is able to be provided.

Accordingly, deterioration of the characteristics of multiplexers each including an inductor defining a phase adjustment element are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
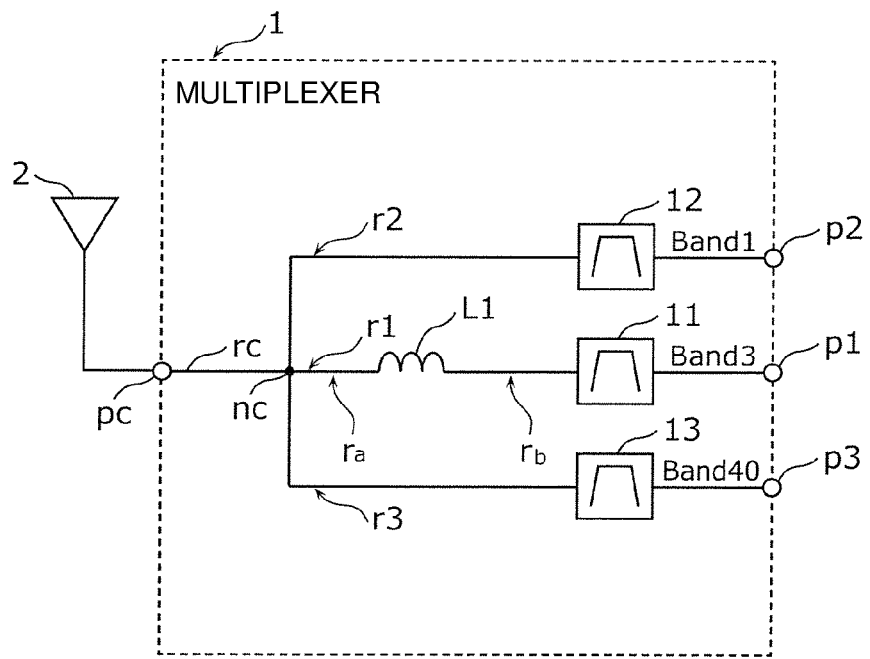
FIG. 1 is a circuit configuration diagram illustrating a first filter, a second filter, a third filter, a common connection point, and an inductor included in a multiplexer according to a first preferred embodiment of the present invention.

Hereinafter, preferred embodiments of the present invention will be described in detail using examples and with reference to the drawings. Note that all of the preferred embodiments described below illustrate comprehensive or specific examples. Numerals, shapes, materials, elements, and the arrangement and connection configuration of the elements discussed in the following preferred embodiments are only exemplary and are not construed to limit the present invention. Among the elements in the following preferred embodiments, elements that are not described in independent claims are described as arbitrary elements. In addition, the sizes or size ratios of elements illustrated in the drawings are not necessarily precise. In addition, the same or substantially the same configurations are denoted by the same reference symbol in the drawings, and overlapping descriptions may be omitted or simplified. In the following preferred embodiments, "connected" includes not only the case in which elements are directly connected to each other, but also the case in which elements are electrically coupled to each other with another element interposed therebetween.

First Preferred Embodiment

The circuit configuration of a multiplexer 1 according to a first preferred embodiment will be described.

The multiplexer 1 includes a plurality of filters having different passbands. In the present preferred embodiment, a multiplexer applied to Band 1 (reception band: about 2110 MHz to about 2170 MHz inclusive), Band 3 (reception band: about 1805 MHz to about 1880 MHz inclusive), and Band 40 (reception band: about 2300 MHz to about 2400 MHz inclusive) of the Third Generation Partnership Project (3GPP) will be described for example.

FIG. 1 is a circuit configuration diagram illustrating the multiplexer 1 according to the first preferred embodiment.

The multiplexer 1 includes, as terminals connected to the outside, a common terminal pc, a first terminal p1, a second terminal p2, and a third terminal p3. An antenna element 2 is connected to the common terminal pc. Each of the first terminal p1, the second terminal p2, and the third terminal p3 is connected to an RF signal processing circuit (radio frequency integrated circuit (RFIC), not illustrated), with an amplifier circuit or other suitable circuit (not illustrated) interposed therebetween, outside the multiplexer 1.

As illustrated in FIG. 1, the multiplexer 1 includes a first filter 11, a second filter 12, a third filter 13, an inductor L1, and a common connection point Nc.

The first filter 11 is disposed on a first signal path r1, which is a portion of a path connecting the common terminal pc and the first terminal p1. The first filter 11 is preferably, for example, a reception filter whose passband is the downlink frequency band (reception band) of Band 3. The first filter 11 receives a reception wave input from the common terminal pc, filters the reception wave in the passband of Band 3, and outputs the filtered wave to the first terminal p1.

The second filter 12 is disposed on a second signal path r2, which is a portion of a path connecting the common terminal pc and the second terminal p2. The second filter 12 is preferably, for example, a reception filter whose passband is the downlink frequency band (reception band) of Band 1. The second filter 12 receives a reception wave input from the common terminal pc, filters the reception wave in the passband of Band 1, and outputs the filtered wave to the second terminal p2.

The third filter 13 is disposed on a third signal path r3, which is a portion of a path connecting the common terminal pc and the third terminal p3. The third filter 13 is preferably, for example, a reception filter whose passband is the downlink frequency band (reception band) of Band 40. The third filter 13 receives a reception wave input from the common terminal pc, filters the reception wave in the passband of Band 40, and outputs the filtered wave to the third terminal p3.

The passband of the first filter 11 is lower than the passband of the second filter 12. In addition, the passband of the first filter 11 is lower than the passband of the third filter 13. In the present preferred embodiment, the first filter 11 is a filter whose passband is lowest among a plurality of filters connected at the common connection point nc.

The first signal path r1, the second signal path r2, and the third signal path r3 are connected to one another at the common connection point nc, which is positioned on the common terminal pc side viewed from the individual filters 11, 12, and 13. The common connection point nc is connected to the common terminal pc with a common signal path rc, which is positioned between the common connection point nc and the common terminal pc, interposed therebetween. In other words, the common connection point nc is a branching point at which the common signal path rc, extracted from the common terminal pc, branches to the first signal path r1, the second signal path r2, and the third signal path r3.

The inductor L1 is disposed in series on a path connecting the common connection point nc and the first filter 11, which is a portion of the first signal path r1. That is, the inductor L1 is connected in series to the common connection point nc and the first filter 11. Specifically, as illustrated in FIG. 1, one of two ends of the inductor L1 is connected to the common connection point nc with a first wiring line ra interposed therebetween, and the other end of the inductor L1 is connected to the first filter 11 with a second wiring line rb interposed therebetween. The length of the first wiring line ra is designed to be shorter than the length of the second wiring line rb. This will be described in detail later.

The inductor L1 defines and functions as a phase adjustment element and is provided to increase, in the case in which the first filter 11 is viewed from the common connection point nc, impedance in a partner band (the passband of the second filter 12 or the third filter 13) different from the passband of the first filter 11 while matching impedance in the passband of the first filter 11.

Although the multiplexer 1 including three filters has been described in the above-described preferred embodiment, the number of filters connected to the common connection point nc is not limited to three. For example, the number of filters connected to the common connection point nc may be two or four or more.

Next, the wiring structure of the multiplexer 1 will be described.

Figure 2:
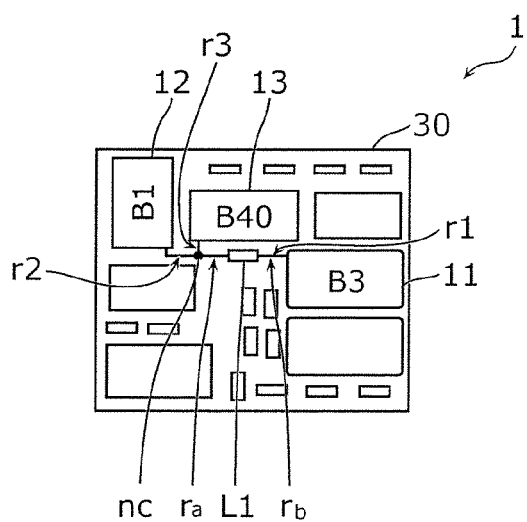
FIG. 2 is a plan view in the case in which the multiplexer according to the first preferred embodiment of the present invention is viewed from a direction orthogonal or substantially orthogonal to a substrate.
Figure 3:
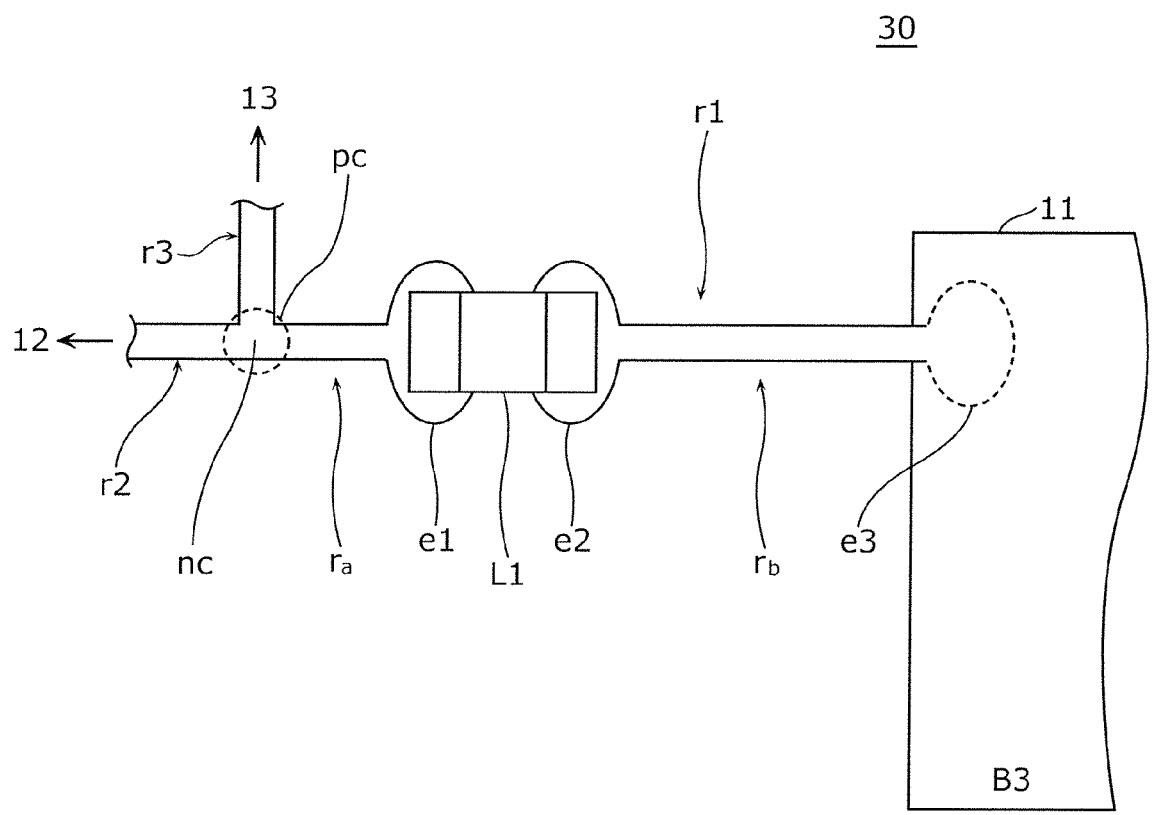
FIG. 3 is a plan view in the case in which the inductor and wiring lines included in the multiplexer according to the first preferred embodiment of the present invention are viewed from a direction orthogonal or substantially orthogonal to the substrate.

FIG. 2 is a plan view in the case in which the multiplexer 1 is viewed from a direction orthogonal or substantially orthogonal to a substrate 30. FIG. 3 is a plan view in the case in which the inductor L1 and wiring lines included in the multiplexer 1 are viewed from a direction orthogonal or substantially orthogonal to the substrate 30. Note that, in FIG. 2, other electrical elements different from the filters and the inductor included in the multiplexer 1 are also mounted.

As illustrated in FIG. 2, the multiplexer 1 includes the substrate 30, and the first filter 11, the second filter 12, the third filter 13, and the inductor L1, which are mounted on a first main surface of the substrate 30 (front side of the page of FIG. 2). The common connection point nc is provided on the first main surface of the substrate 30.

The substrate 30 is preferably, for example, a laminated substrate including a plurality of ceramic base material layers that are laminated. On the first main surface of the substrate 30, a plurality of wiring lines defining the first signal path r1, the second signal path r2, and the third signal path r3, and a plurality of land electrodes are provided. The substrate 30 may preferably be a printed circuit board (PCB) including a resin material, for example.

Each of the first filter 11, the second filter 12, and the third filter 13 includes an elastic wave element, such as a surface acoustic wave (SAW) filter, for example. Each of the first filter 11, the second filter 12, and the third filter 13 is preferably, for example, a rectangular or substantially rectangular parallelepiped chip component, for example, and is connected to a land electrode on the substrate 30 using a bonding member, such as solder, for example.

The inductor L1 is preferably, for example, a laminated chip inductor including a coil-shaped or substantially coil-shaped conductor. The inductor L1 is connected to a land electrode on the substrate 30 using a bonding member, such as solder, for example. The inductor L1 including a coil-shaped or substantially coil-shaped conductor has a greater inductance than other inductors. Thus, it is possible to provide a large range in which the phase is adjusted by the inductor L1. The inductor L1 may be a winding inductor or an inductor provided in the substrate 30.

The common connection point nc is positioned in an area at which the first signal path r1, the second signal path r2, and the third signal path r3 intersect. The common connection point nc is connected by the common signal path rc provided inside the substrate 30 to the common terminal pc provided on a second main surface of the substrate 30. The common signal path rc is preferably defined by, for example, a via conductor. Note that a wiring line connecting the common terminal pc and the antenna element 2 is provided on the second main surface of the substrate 30.

A distance connecting the common connection point nc and the first filter 11 on the first signal path r1 is longer than a distance connecting the common connection point nc and the second filter 12 on the second signal path r2 or a distance connecting the common connection point nc and the third filter 13 on the third signal path r3.

In addition, on the first signal path r1, a distance connecting the common connection point nc and the inductor L1 is shorter than a distance connecting the inductor L1 and the first filter 11. Specifically, as illustrated in FIG. 3, on the first signal path r1, the common connection point nc and the inductor L1 are connected by the first wiring line ra, and the inductor L1 and the first filter 11 are connected by the second wiring line rb. Also, the first wiring line ra is shorter in length than the second wiring line rb.

The first wiring line ra connects the common connection point nc and a first land electrode e1 to which the inductor L1 is connected. The second wiring line rb connects a second land electrode e2 to which the inductor L1 is connected and a land electrode e3 to which the first filter 11 is connected. For example, preferably, the length of the first wiring line ra is about 0.5 mm, and the length of the second wiring line rb is about 1.5 mm. In addition, the length of the first wiring line ra is preferably, for example, less than or equal to about one third of the length of the second wiring line rb. Note that, preferably, the first wiring line ra and the second wiring line rb have the same or substantially the same width and thickness, and are made of the same metal material.

In this manner, on the first signal path r1, the length of the first wiring line ra connecting the common connection point nc and the inductor L1 is shorter than the second wiring line rb connecting the inductor L1 and the first filter 11, thus reducing a stray capacitance generated by the first wiring line ra. Accordingly, deterioration of the characteristics of the multiplexer 1 is able to be reduced or prevented.

In addition, the first wiring line ra is shorter than the second wiring line rb, thus reducing or preventing, for example, the occurrence of higher-mode spurious emission caused by a stray capacitance generated on the first wiring line ra. Accordingly, an increase in an insertion loss in a partner band (such as Band 1 or Band 40) having a higher passband than the first filter 11 is able to be reduced or prevented.

Here, in order to describe the advantageous effects of the first preferred embodiment, a multiplexer of the first preferred embodiment and a multiplexer of a comparative example will be described for example with reference to FIGS. 4A to 5C. In the following example, the case of the first preferred embodiment in which the length of the first wiring line ra is set to about 0.5 mm and the length of the second wiring line rb is set to about 1.5 mm (ra<rb), and the case of the comparative example in which the length of the first wiring line ra is set to about 1.5 mm and the length of the second wiring line rb is set to about 0.5 mm (ra>rb) will be discussed. Note that "ra=" and "rb=" in FIGS. 4A to 5C indicate the lengths of wiring lines. The inductance value of the inductor L1 is set to about 1.5 nH.

In addition, "the case in which the first filter 11 alone is viewed from the common connection point nc" described below refers to the case in which the first filter 11 is viewed from the common connection point nc while separating the second filter 12 and the third filter 13.

Figure 4A:
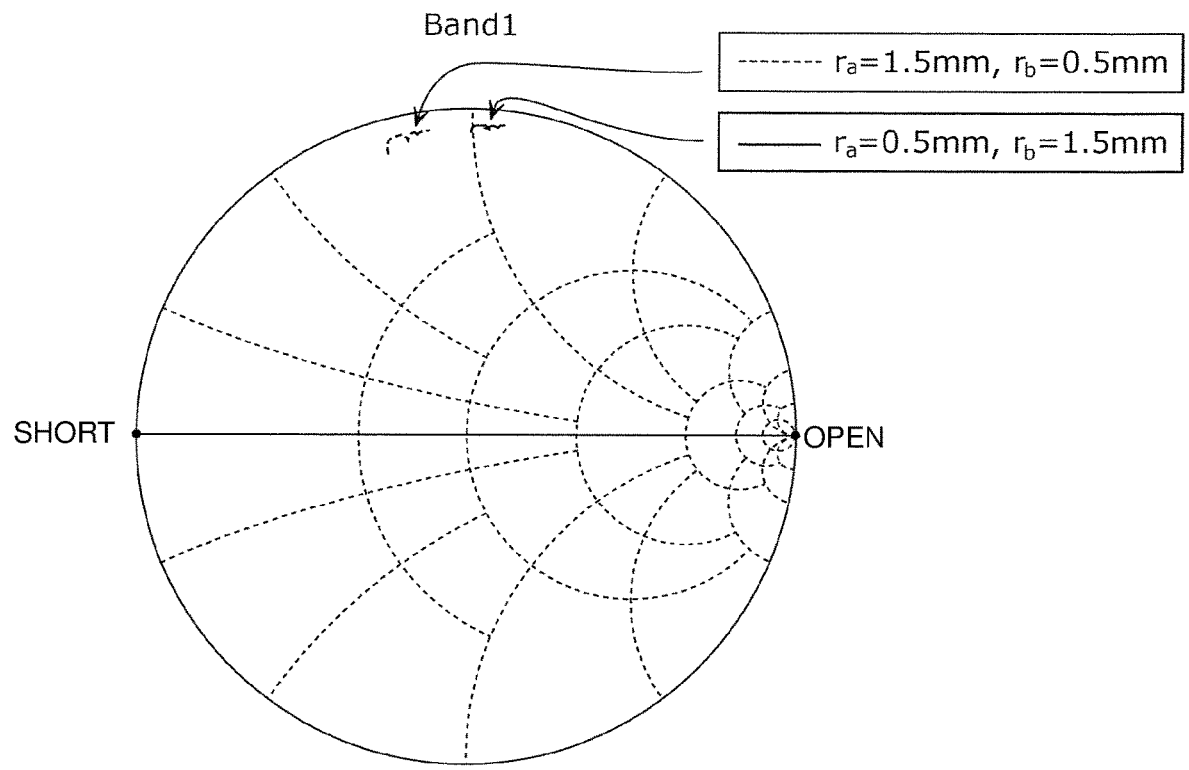
FIG. 4A is a Smith chart illustrating the impedance in Band 1 in the case in which the first filter alone is viewed from the common connection point in the first preferred embodiment of the present invention.

FIG. 4A is a Smith chart illustrating the impedance in Band 1 in the case in which the first filter 11 alone is viewed from the common connection point nc. As illustrated in FIG. 4A, the impedance of the first preferred embodiment in Band 1 (solid line) is positioned closer to open than the impedance of the comparative example (broken line). Therefore, the first filter 11 of the first preferred embodiment is able to increase the amount of attenuation in Band 1, which is a partner band, compared with the comparative example.

Figure 4B:
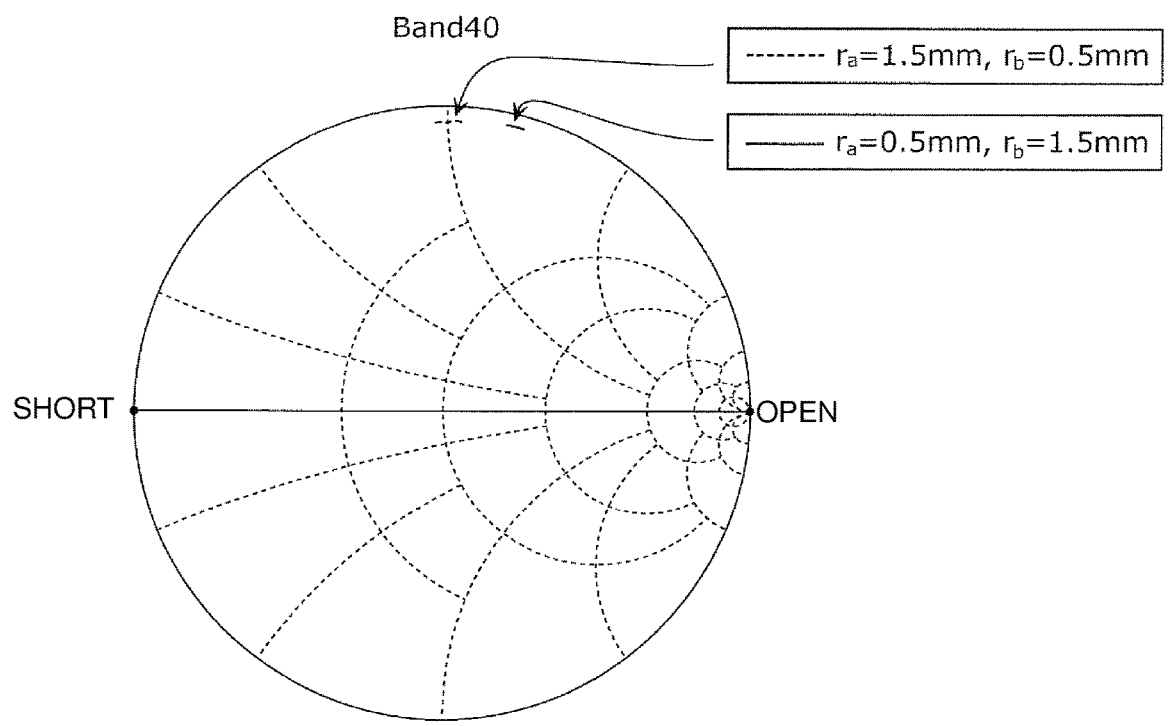
FIG. 4B is a Smith chart illustrating the impedance in Band 40 in the case in which the first filter alone is viewed from the common connection point in the first preferred embodiment of the present invention.

FIG. 4B is a Smith chart illustrating the impedance in Band 40 in the case in which the first filter 11 alone is viewed from the common connection point nc. As illustrated in FIG. 4B, the impedance of the first preferred embodiment in Band 40 (solid line) is positioned closer to open than the impedance of the comparative example (broken line). Therefore, the first filter 11 of the first preferred embodiment is able to increase the amount of attenuation in Band 40, which is a partner band, compared with the comparative example.

Figure 5A:
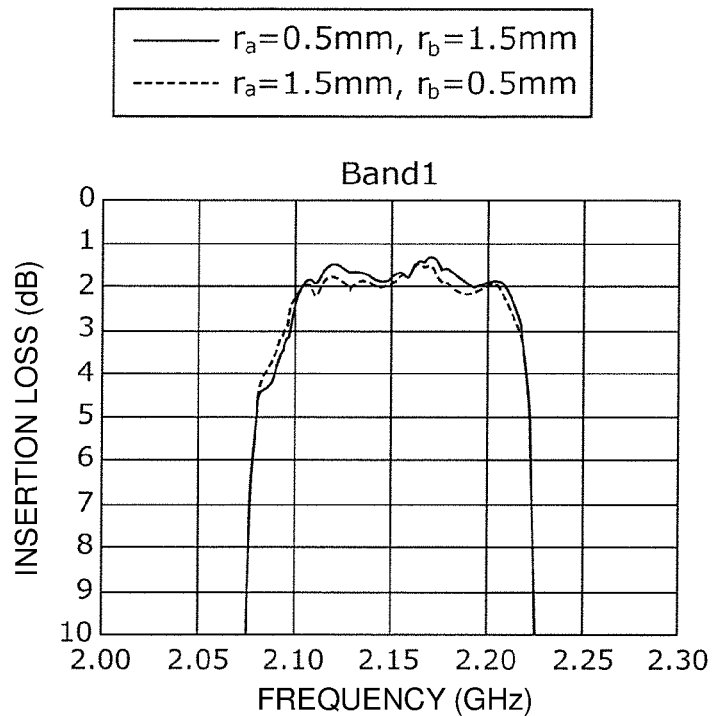
FIG. 5A is a diagram illustrating bandpass characteristics in Band 1 between a common terminal and a second terminal of the multiplexer according to the first preferred embodiment of the present invention.

FIG. 5A is a diagram illustrating bandpass characteristics in Band 1 between the common terminal pc and the second terminal p2 of the multiplexer 1. In FIG. 5A, when the bandpass characteristics of the first preferred embodiment (solid line) and the bandpass characteristics of the comparative example (broken line) in Band 1 are compared with each other, the insertion loss is smaller in the first preferred embodiment than in the comparative example. That is, as illustrated in FIG. 4A, the impedance in Band 1, which is a partner band of the first filter 11, is closer to open. Therefore, as illustrated in FIG. 5A, the multiplexer 1 of the first preferred embodiment is able to reduce or prevent an increase in insertion loss in Band 1, which is the passband of the second filter 12, for an RF signal passing through the second filter 12.

Figure 5B:
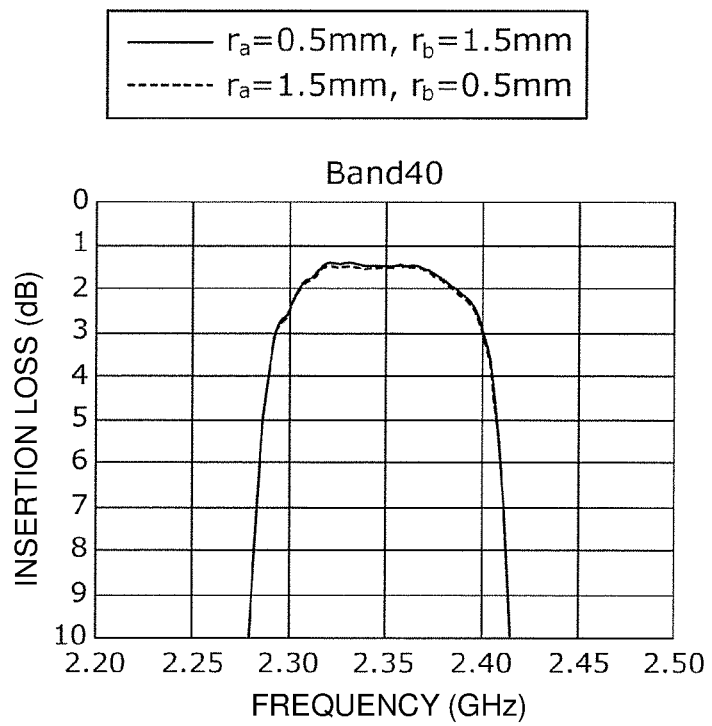
FIG. 5B is a diagram illustrating bandpass characteristics in Band 40 between the common terminal and a third terminal of the multiplexer according to the first preferred embodiment of the present invention.

FIG. 5B is a diagram illustrating bandpass characteristics in Band 40 between the common terminal pc and the third terminal p3 of the multiplexer 1. In FIG. 5B, when the bandpass characteristics of the first preferred embodiment (solid line) and the bandpass characteristics of the comparative example (broken line) in Band 40 are compared with each other, the insertion loss is smaller in the first preferred embodiment than in the comparative example. That is, as illustrated in FIG. 4B, the impedance in Band 40, which is a partner band of the first filter 11, is closer to open. Therefore, as illustrated in FIG. 5B, the multiplexer 1 of the first preferred embodiment is able to reduce or prevent an increase in insertion loss in Band 40, which is the passband of the third filter 13, for an RF signal passing through the third filter 13.

Figure 5C:
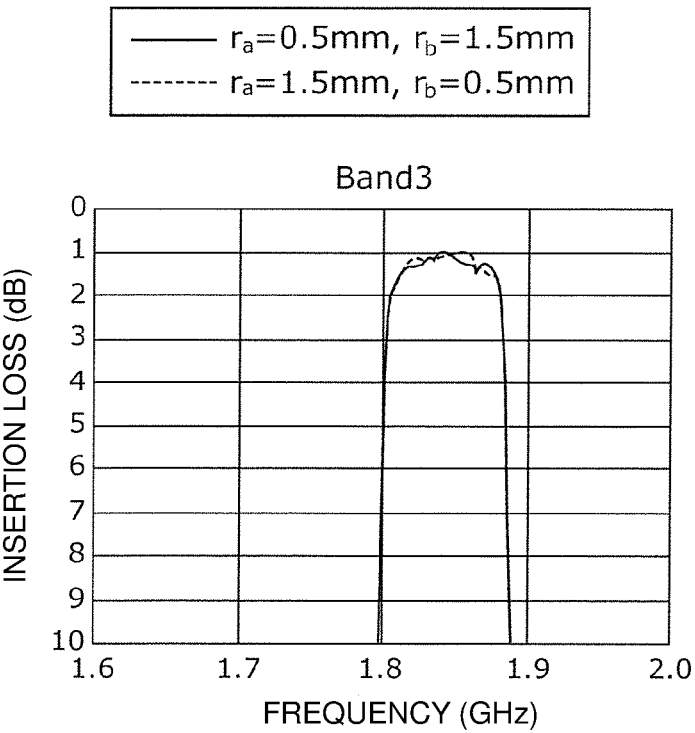
FIG. 5C is a diagram illustrating bandpass characteristics in Band 3 between the common terminal and a first terminal of the multiplexer according to the first preferred embodiment of the present invention.

FIG. 5C is a diagram illustrating bandpass characteristics in Band 3 between the common terminal pc and the first terminal p1 of the multiplexer 1. As illustrated in FIG. 5C, the bandpass characteristics of the first preferred embodiment (solid line) and the bandpass characteristics of the comparative example (broken line) in Band 3 have the same or substantially the same curve. That is, as in the multiplexer 1 of the first preferred embodiment, characteristics in Band 3, which is the passband of the first filter 11, do not deteriorate even if the length of the first wiring line ra is shorter than the length of the second wiring line rb in the first filter 11.

In this manner, deterioration of the characteristics of the multiplexer 1 is able to be reduced or prevented by making the length of the first wiring line ra shorter than the length of the second wiring line rb on the first signal path r1.

Next, referring to FIGS. 6 and 7, the reason that the length of the first wiring line ra is made shorter than the length of the second wiring line rb on the first signal path r1 will be described.

Figure 6:
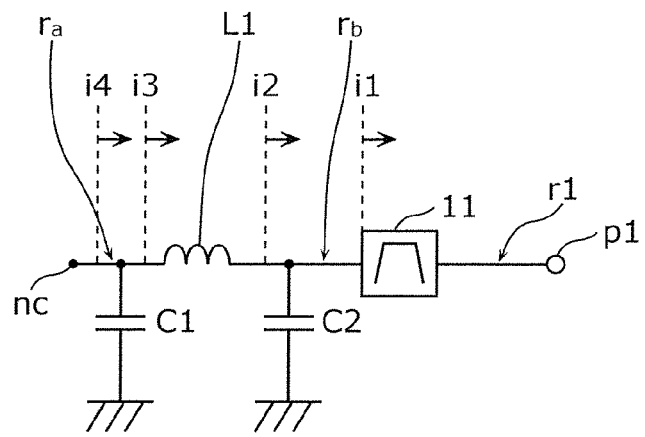
FIG. 6 is a diagram illustrating a circuit configuration between the common connection point and the first filter in the first preferred embodiment of the present invention as an equivalent circuit.

FIG. 6 is a diagram illustrating a circuit configuration between the common connection point nc and the first filter 11 in the first preferred embodiment as an equivalent circuit. FIG. 7 is a Smith chart schematically illustrating impedance in the case in which the first filter 11 is viewed from the respective positions at viewpoints i1, i2, i3, and i4 in the equivalent circuit illustrated in FIG. 6.

In the equivalent circuit of FIG. 6, it is illustrated that a stray capacitance C1 is generated by the first wiring line ra connecting the common connection point nc and the inductor L1, and a stray capacitance C2 is generated by the second wiring line rb connecting the inductor L1 and the first filter 11. The stray capacitances C1 and C2 become larger as the wiring lines become longer. For example, the stray capacitance C1 becomes larger as the first wiring line ra becomes longer, and the stray capacitance C1 becomes smaller as the first wiring line ra becomes shorter.

Here, impedance in the case in which the first filter 11 alone is viewed from the common connection point nc will be examined. The viewpoint i1 illustrated in FIG. 6 indicates the case in which the first filter 11 is viewed in a state in which the first wiring line ra and the second wiring line rb are not connected to the first filter 11, that is, in a state in which there is no stray capacitance C1 or C2. The viewpoint i2 illustrated in FIG. 6 indicates the case in which the first filter 11 is viewed in a state in which the second wiring line rb is connected to the first filter 11, and a stray capacitance C2 is generated. The viewpoint i3 illustrated in FIG. 6 indicates the case in which the first filter 11 is viewed in a state in which the inductor L1 is further connected to the second wiring line rb. The viewpoint i4 illustrated in FIG. 6 indicates the case in which the first filter 11 is viewed in a state in which the first wiring line ra is further connected to the inductor L1, and a stray capacitance C1 is further generated.

Figure 7:
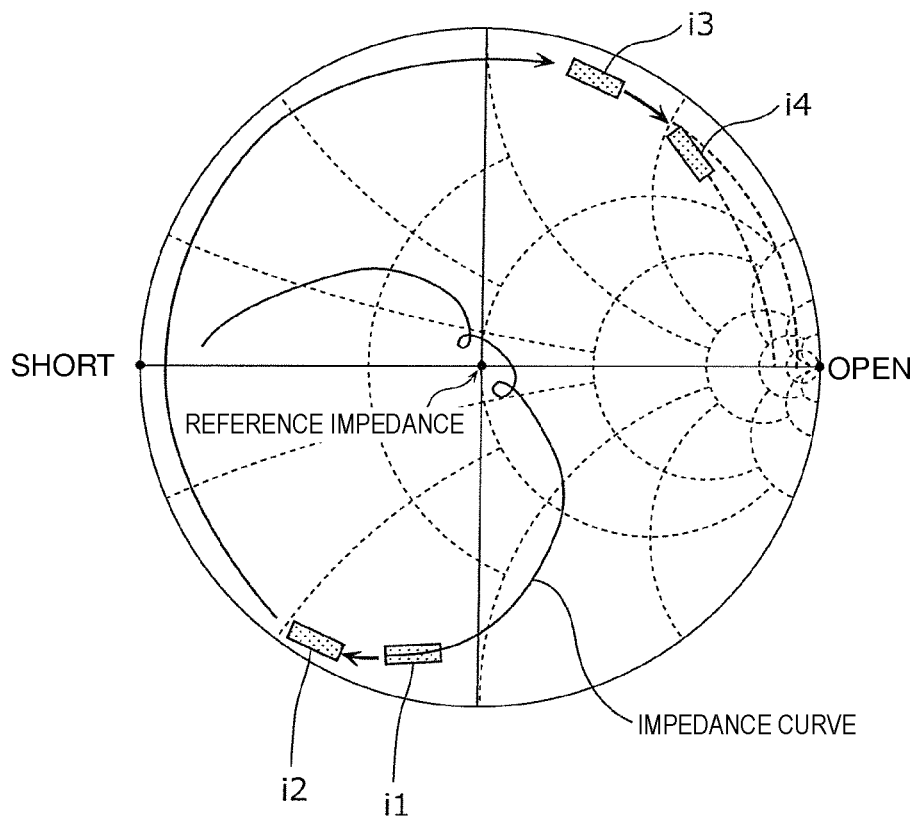
FIG. 7 is a Smith chart schematically illustrating impedance in the case in which the first filter is viewed from the respective positions at viewpoints i1, i2, i3, and i4 in the equivalent circuit illustrated in FIG. 6.

The impedance of the first filter 11 at the viewpoint i1 is represented as, for example, an impedance curve illustrated in FIG. 7. A reference impedance of the first filter 11 whose passband is Band 3 is set to about 50Ω. In that case, partner bands of the first filter 11 (Band 1 and Band 40) are positioned in, for example, an area indicated by the viewpoint i1 in FIG. 7. An area indicated by the viewpoint i1 is within a capacitive area (an area representing a capacitive reactance on the Smith chart).

The impedance of the first filter 11 at the viewpoint i2 moves clockwise along an equiconductance circle because the stray capacitance C2 is added. Accordingly, the impedance in the partner bands of the first filter 11 moves to, for example, an area indicated by the viewpoint i2 in FIG. 7. Because the impedance in the partner bands of the first filter 11 moves to an outer portion on the Smith chart, the impedance changes in a direction in which the reflection coefficient increases. That is, even with the addition of the stray capacitance C2 due to an increase of the length of the second wiring line rb, the reflection coefficient in the partner bands of the first filter 11 does not decrease, which means that there is only a small influence on the insertion loss in the partner bands.

The impedance of the first filter 11 at the viewpoint i3 moves clockwise from the capacitive area to an inductive area (an area representing an inductive reactance on the Smith chart) because the inductor L1 that provides phase adjustment is connected. Accordingly, the impedance in the partner bands of the first filter 11 moves to, for example, an area indicated by the viewpoint i3 in FIG. 7. With this movement, the phase of the first filter 11 is adjusted, and the impedance of the multiplexer 1 is matched.

The impedance of the first filter 11 at the viewpoint i4 moves clockwise along an equiconductance circle because the stray capacitance C1 is added. Accordingly, the impedance in the partner bands of the first filter 11 moves to, for example, an area indicated by the viewpoint i4 in FIG. 7. Because the impedance in the partner bands of the first filter 11 moves to an inner portion on the Smith chart, the impedance changes in a direction in which the reflection coefficient decreases. That is, with the addition of the stray capacitance C1 due to an increase of the length of the first wiring line ra, the reflection coefficient in the partner bands of the first filter 11 decreases, resulting in an increase in the insertion loss in the partner bands. Therefore, it becomes necessary to reduce or prevent the stray capacitance C1 generated by the first wiring line ra by making the first wiring ra shorter.

In the multiplexer 1 of the present preferred embodiment, on the first signal path r1, a distance connecting the common connection point nc and the inductor L1 is shorter than a distance connecting the inductor L1 and the first filter 11. That is, on the first signal path r1, the length of the first wiring line ra connecting the common connection point nc and the inductor L1 is shorter than the second wiring line rb connecting the inductor L1 and the first filter 11. Accordingly, a stray capacitance generated by the first wiring line ra is reduced, thus reducing or preventing deterioration of the characteristics of the multiplexer 1.

Figure 8:
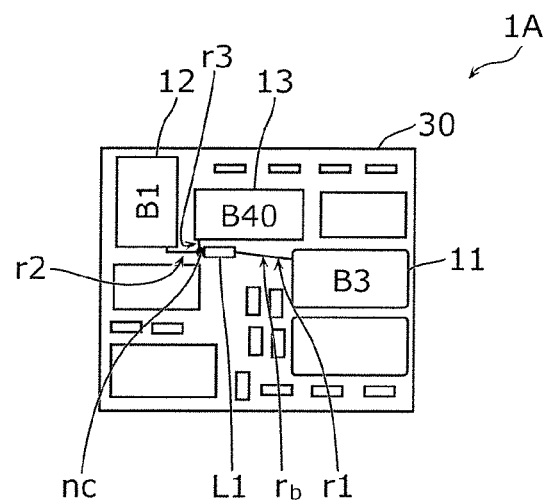
FIG. 8 is a plan view illustrating a multiplexer according to a first modification of the first preferred embodiment of the present invention.
Figure 9:
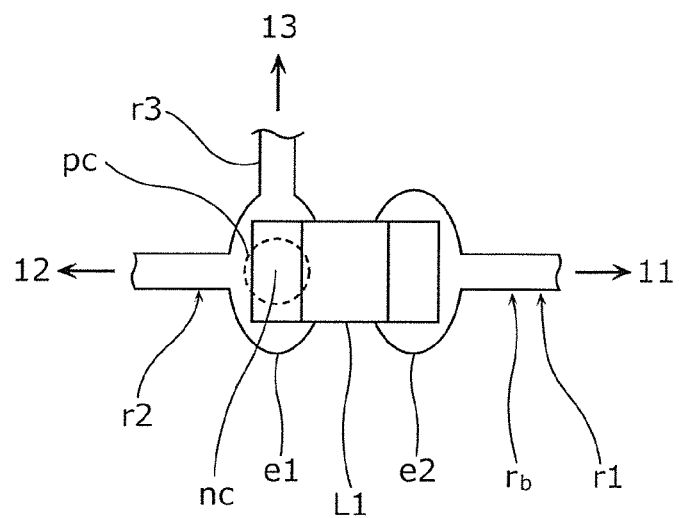
FIG. 9 is a plan view illustrating the inductor and wiring lines in the first modification of the first preferred embodiment of the present invention.

FIG. 8 is a plan view illustrating a multiplexer 1A according to a first modification of the first preferred embodiment. FIG. 9 is a plan view illustrating the inductor L1 and wiring lines in the first modification of the first preferred embodiment.

In the multiplexer 1A of the first modification, the length of the first wiring line ra is substantially 0, and the first wiring line ra is shorter than the second wiring line rb. That is, on the first signal path r1, a distance connecting the common connection point nc and the inductor L1 is shorter than a distance connecting the inductor L1 and the first filter 11. Specifically, as illustrated in FIG. 9, one external terminal of the first filter 11 is connected to a land electrode e1 provided at the same or substantially the same position as the common connection point nc.

In the multiplexer 1A according to the first modification of the first preferred embodiment, on the first signal path r1, a distance connecting the common connection point nc and the inductor L1 is shorter than a distance connecting the inductor L1 and the first filter 11. Accordingly, a stray capacitance generated on a path between the common connection point nc and the inductor L1 is reduced, thus reducing or preventing deterioration of the characteristics of the multiplexer 1A.

Figure 10A:
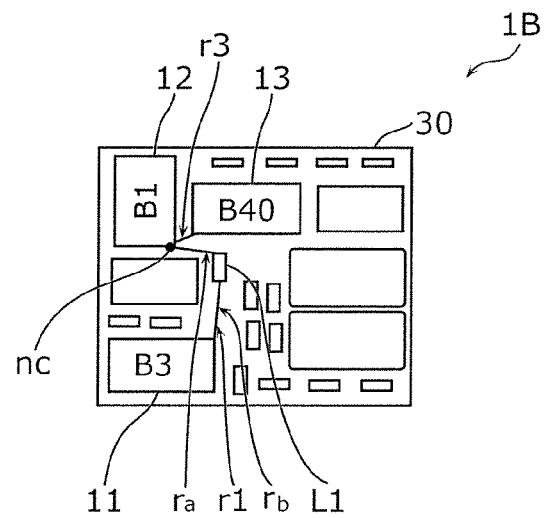
FIG. 10A is a plan view illustrating a multiplexer according to a second modification of the first preferred embodiment of the present invention.
Figure 10B:
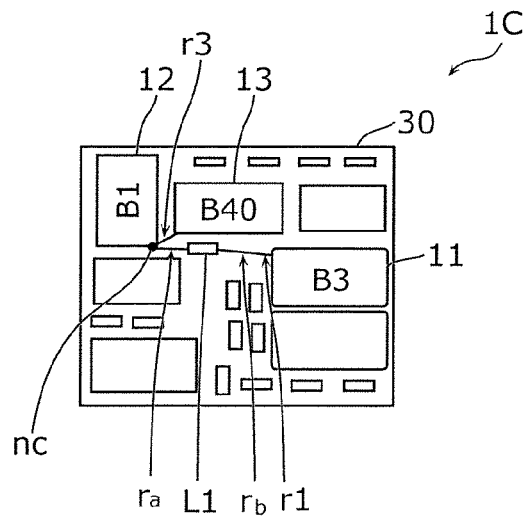
FIG. 10B is a plan view illustrating a multiplexer according to a third modification of the first preferred embodiment of the present invention.
Figure 10C:
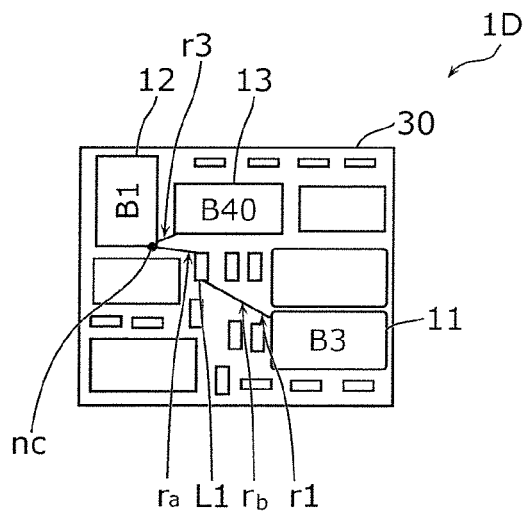
FIG. 10C is a plan view illustrating a multiplexer according to a fourth modification of the first preferred embodiment of the present invention.

FIG. 10A is a plan view illustrating a multiplexer 1B according to a second modification of the first preferred embodiment. FIG. 10B is a plan view illustrating a multiplexer 1C according to a third modification of the first preferred embodiment. FIG. 10C is a plan view illustrating a multiplexer 1D according to a fourth modification of the first preferred embodiment.

In the multiplexers 1B, 1C, and 1D of the second, third, and fourth modifications, the position of the first filter 11 on the substrate 30 is different.

In addition, in the multiplexers 1B, 1C, and 1D of the second, third, and fourth modifications, the common connection point nc is provided at the same or substantially the same position as a land electrode to which the second filter 12 is connected. Therefore, a distance connecting the common connection point nc and the first filter 11 on the first signal path r1 is longer than a distance connecting the common connection point nc and the third filter 13 on the third signal path r3, but is shorter than a distance connecting the common connection point nc and the second filter 12 on the second signal path r2.

Also in the multiplexers 1B to 1D according to the second to fourth modifications of the first preferred embodiment, on the first signal path r1, a distance connecting the common connection point nc and the inductor L1 is shorter than a distance connecting the inductor L1 and the first filter 11. That is, on the first signal path r1, the length of the first wiring line ra connecting the common connection point nc and the inductor L1 is shorter than the second wiring line rb connecting the inductor L1 and the first filter 11. Accordingly, a stray capacitance generated on a path between the common connection point nc and the inductor L1 is reduced, thus reducing or preventing deterioration of the characteristics of the multiplexers 1B to 1D.

Note that the second filter 12 of the first preferred embodiment and the first to fourth modifications of the first preferred embodiment is not limited to Band 1, but may be set to Band 66 (reception band: about 2110 MHz to about 2200 MHz inclusive) of 3GPP.

In addition, in the first preferred embodiment and the first to fourth modifications of the first preferred embodiment, the first filter 11 may be set to Band 4 (reception band: about 2110 MHz to about 2155 MHz inclusive), the second filter 12 may be set to Band 25 (reception band: about 1930 MHz to about 1955 MHz inclusive), and the third filter 13 may be set to Band 30 (reception band: about 2350 MHz to about 2360 MHz inclusive). In this case, the first filter 11 may be set to Band 66, and the second filter 12 may be set to Band 2 (reception band: about 1930 MHz to about 1990 MHz inclusive).

Second Preferred Embodiment

The circuit configuration of a multiplexer 1E according to a second preferred embodiment of the present invention will be described. The multiplexer 1E according to the second preferred embodiment further includes, in addition to the multiplexer 1 of the first preferred embodiment, a plurality of filters having passbands that are different from the multiplexer 1.

In the second preferred embodiment, the multiplexer 1E applied to Band 1, Band 3, Band 40, Band 25, Band 66, and Band 30 of 3GPP will be described by way of example.

Figure 11:
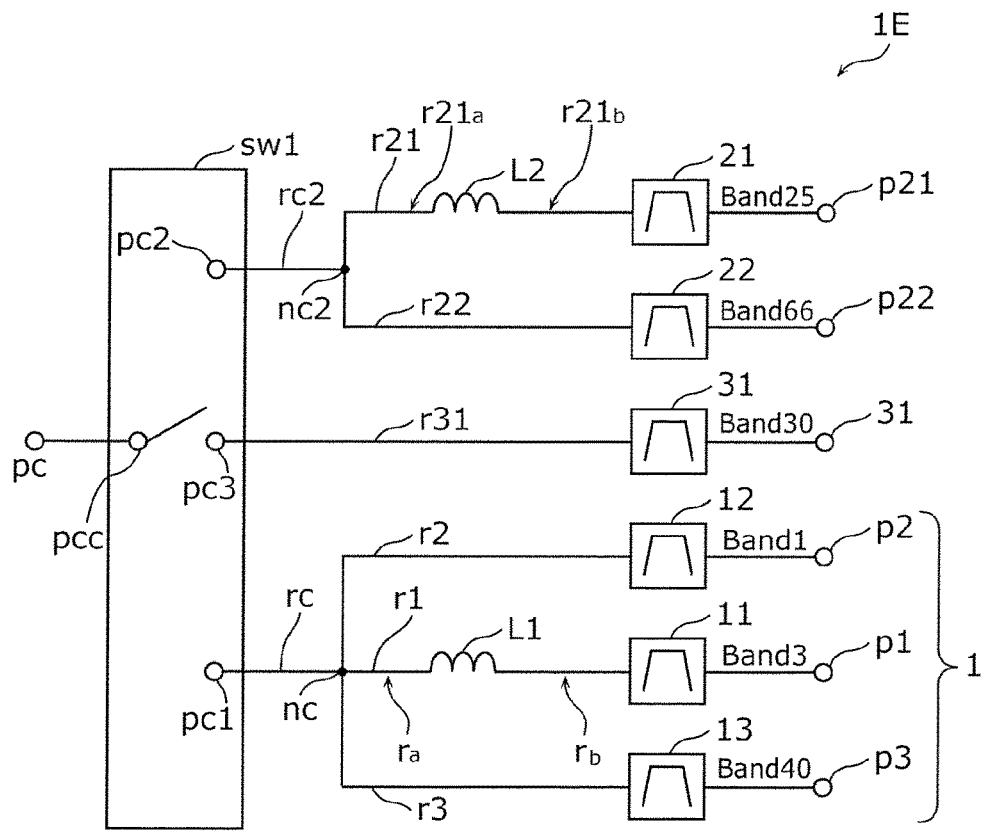
FIG. 11 is a circuit configuration diagram illustrating a multiplexer according to a second preferred embodiment of the present invention.

FIG. 11 is a circuit configuration diagram illustrating the multiplexer 1E according to the second preferred embodiment.

The multiplexer 1E includes the common terminal pc, the first terminal p1, the second terminal p2, and the third terminal p3. The multiplexer 1E further includes, terminals p21, p22, and p31 connected to the outside. Each of the terminals p21, p22, and p31 is connected to an RF signal processing circuit with an amplifier circuit or other suitable circuit interposed therebetween.

A switch sw1 is disposed among the common terminal pc, the first terminal p1, the second terminal p2, the third terminal p3, and the terminals p21, p22, and p31.

The switch sw1 is preferably, for example, a single pole double throw (SPDT) switch, and includes a switch common terminal pcc, and a plurality of selection terminals including a first selection terminal pc1 and second selection terminals pc2 and pc3. The switch sw1 includes one or more switch elements that alternately connect the switch common terminal pcc and one selection terminal (such as the first selection terminal pc1), and the switch common terminal pcc and another selection terminal (such as the second selection terminal pc2). The switch element(s) is preferably, for example, a field effect transistor(s) (FETs).

The first selection terminal pc1 of the switch sw1 corresponds to the common terminal pc discussed in the first preferred embodiment. The first selection terminal pc1 is connected to the common connection point nc of the multiplexer 1 discussed in the first preferred embodiment.

As illustrated in FIG. 11, the multiplexer 1E includes the first filter 11, the second filter 12, the third filter 13, the inductor L1, and the common connection point nc. The multiplexer 1E further includes filters 21, 22, and 31, an inductor L2, and a common connection point nc2.

The filter 21 is disposed on a signal path r21, which is a portion of a path connecting the second selection terminal pc2 and the terminal p21. The filter 21 is preferably, for example, a reception filter whose passband is the downlink frequency band (reception band) of Band 25. The filter 21 receives a reception wave input from the second selection terminal pc2, filters the reception wave in the passband of Band 25, and outputs the filtered wave to the terminal p21. The passband of the filter 21 is lower than the passband of the filter 22, which is described below.

The filter 22 is disposed on a signal path r22, which is a portion of a path connecting the second selection terminal pc2 and the terminal p22. The filter 22 is preferably, for example, a reception filter whose passband is the downlink frequency band (reception band) of Band 66. The filter 22 receives a reception wave input from the second selection terminal pc2, filters the reception wave in the passband of Band 66, and outputs the filtered wave to the terminal p22.

The filter 31 is disposed on a signal path r31, which connects the second selection terminal pc3 and the terminal p31. The filter 31 is preferably, for example, a reception filter whose passband is the downlink frequency band (reception band) of Band 30. The filter 31 receives a reception wave input from the second selection terminal pc3, filters the reception wave in the passband of Band 30, and outputs the filtered wave to the terminal p31.

The signal path r21 and the signal path r22 are connected to each other at the common connection point nc2, which is located on the second selection terminal pc2 side viewed from the individual filters 21 and 22. The common connection point nc2 is connected to the second selection terminal pc2 with a common signal path rc2, which is located between the common connection point nc2 and the second selection terminal pc2, interposed therebetween.

The inductor L2 is disposed in series on a path connecting the common connection point nc2 and the filter 21, which is a portion of the signal path r21. That is, the inductor L2 is connected in series to the common connection point nc2 and the filter 21. The inductor L2 defines a phase adjustment element and is provided to increase, in the case in which the filter 21 is viewed from the common connection point nc2, the impedance in the passband of the filter 22 (partner band) different from the passband of the filter 21 while matching impedance in the passband of the filter 21.

Next, the wiring structure of the multiplexer 1E will be described.

Figure 12:
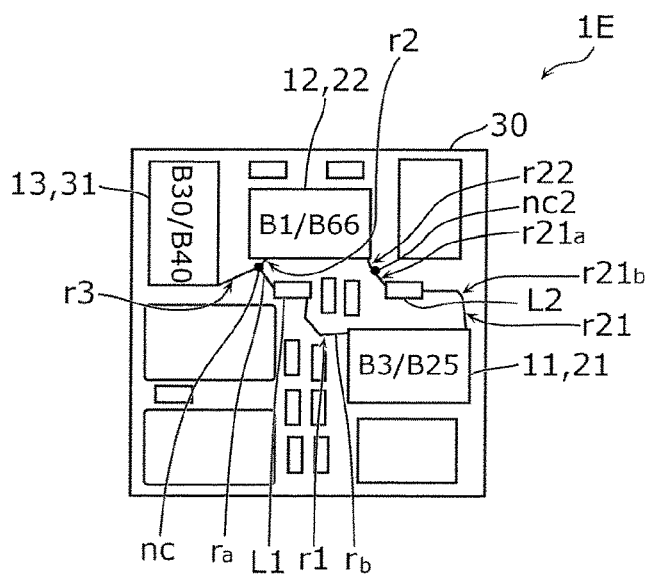
FIG. 12 is a plan view in the case in which the multiplexer according to the second preferred embodiment of the present invention is viewed from a direction orthogonal or substantially orthogonal to the substrate.

FIG. 12 is a plan view in the case in which the multiplexer 1E is viewed from a direction orthogonal or substantially orthogonal to the substrate 30.

As illustrated in FIG. 12, the multiplexer 1E includes the substrate 30, and the first filter 11, the second filter 12, the third filter 13, the inductor L1, the filters 21, 22, and 31, and the inductor L2, which are mounted on a first main surface of the substrate 30 (front surface of the page of FIG. 12). The common connection points nc and nc2 are provided on the first main side of the substrate 30.

On the first main surface of the substrate 30, a plurality of wiring lines defining the first signal path r1, the second signal path r2, the third signal path r3, and the signal paths r21, r22, and r31 (r31 is not illustrated) and a plurality of land electrodes are provided.

Each of the filters 21, 22, and 31 includes an elastic wave element, such as a SAW filter, for example. The first filter 11 and the filter 21 are defined by one chip component. The second filter 12 and the filter 22 are defined by one chip component. The third filter 13 and the filter 31 are defined by one chip component. Each of the chip components preferably has, for example, a rectangular or substantially rectangular parallelepiped shape, and is connected to a land electrode on the substrate 30 using a bonding member, such as solder, for example.

The inductor L2 is preferably, for example, a laminated chip inductor including a coil-shaped or substantially coil-shaped conductor. The inductor L2 is connected to a land electrode on the substrate 30 using a bonding member, such as solder, for example.

The common connection point nc2 is disposed in an area in which the signal paths r21, r22, and r31 intersect. The common connection point nc2 is connected by the common signal path rc2 provided inside the substrate 30 to the second selection terminal pc2 provided on a second main side of the substrate 30 (not illustrated). Note that the switch sw1 is provided on the second main surface of the substrate 30.

On the first signal path r1, a distance connecting the common connection point nc and the inductor L1 is shorter than a distance connecting the inductor L1 and the first filter 11. Specifically, on the first signal path r1, the common connection point nc and the inductor L1 are connected by the first wiring line ra, and the inductor L1 and the first filter 11 are connected by the second wiring line rb. Also, the first wiring line ra is shorter in length than the second wiring line rb.

In this manner, on the first signal path r1, the length of the first wiring line ra connecting the common connection point nc and the inductor L1 is shorter than the second wiring line rb connecting the inductor L1 and the first filter 11, thus reducing a stray capacitance generated by the first wiring line ra. Accordingly, deterioration of the characteristics of the multiplexer 1E is able to be reduced or prevented.

In addition, on the signal path r21, a distance connecting the common connection point nc2 and the inductor L2 is shorter than a distance connecting the inductor L2 and the filter 21. Specifically, on the signal path r21, the common connection point nc2 and the inductor L2 are connected by a first wiring line r21a, and the inductor L2 and the filter 21 are connected by a second wiring line r21b. Also, the first wiring line r21a is shorter in length than the second wiring line r21b.

In this manner, on the signal path r21, the length of the first wiring line r21a connecting the common connection point nc2 and the inductor L2 is shorter than the second wiring line r21b connecting the inductor L2 and the filter 21, thus reducing a stray capacitance generated by the first wiring line r21a. Accordingly, deterioration of the characteristics of the multiplexer 1E is able to be reduced or prevented.

Note that the second filter 12 in the multiplexer 1E is not limited to Band 1, but may be set to Band 66 of 3GPP. In addition, the filter 21 may be set to Band 66; the filter 22 may be set to Band 2; and the filter 31 may be set to Band 30.

In addition, the multiplexer 1E may execute carrier aggregation by simultaneously connecting, for example, the switch common terminal pcc and the first selection terminal pc1, and the switch common terminal pcc and the second selection terminal pc2.

Third Preferred Embodiment

The circuit configuration of a multiplexer 1F according to a third preferred embodiment of the present invention will be described. The multiplexer 1F according to the third preferred embodiment further includes, in addition to the multiplexer 1 of the first preferred embodiment, a filter having a passband that is different from the multiplexer 1. The multiplexer 1F is applied to the case of wirelessly receiving signals in a plurality of passbands at the same time, that is, the case of executing carrier aggregation (CA).

In the third preferred embodiment, the multiplexer 1F applied to Band 1, Band 3, Band 40, and Band 7 (reception band: about 2620 MHz to about 2690 MHz inclusive) of 3GPP will be described by way of example.

Figure 13:
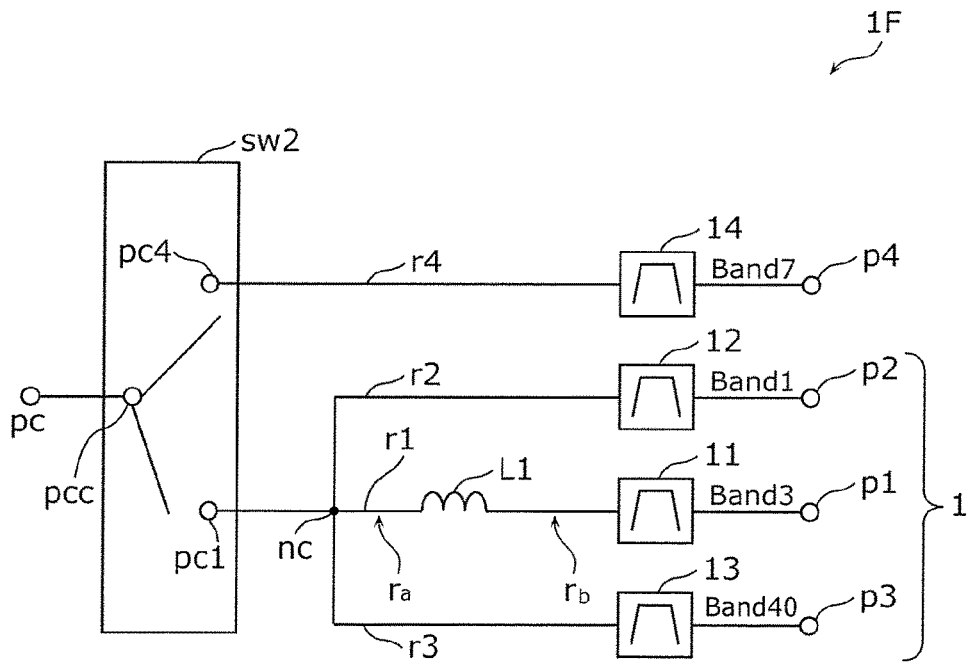
FIG. 13 is a circuit configuration diagram illustrating a multiplexer according to a third preferred embodiment of the present invention, and a fourth filter included in the multiplexer.

FIG. 13 is a circuit configuration diagram illustrating the multiplexer 1F according to the third preferred embodiment.

The multiplexer 1F includes the common terminal pc, the first terminal p1, the second terminal p2, and the third terminal p3. The multiplexer 1F further includes a fourth terminal p4 connected to the outside. The fourth terminal p4 is connected to an RF signal processing circuit with an amplifier circuit or other suitable circuit interposed therebetween.

A switch sw2 is disposed among the common terminal pc, the first terminal p1, the second terminal p2, the third terminal p3, and the fourth terminal p4.

The switch sw2 is preferably, for example, an SPDT switch, and includes a switch common terminal pcc, and a plurality of selection terminals including a first selection terminal pc1 and a second selection terminal pc4. The switch sw2 includes one or more switch elements that simultaneously connect the switch common terminal pcc and the first selection terminal pc1, and the switch common terminal pcc and the second selection terminal pc4. The switch common terminal pcc of the switch sw2 may include two terminals that are connected to each other.

The first selection terminal pc1 of the switch sw2 corresponds to the common terminal pc described in the first preferred embodiment. The first selection terminal pc1 is connected to the common connection point nc of the multiplexer 1 discussed in the first preferred embodiment.

The multiplexer 1F includes the first filter 11, the second filter 12, the third filter 13, the inductor L1, and the common connection point nc. The multiplexer 1F further includes a fourth filter 14.

The fourth filter 14 is disposed on a fourth signal path r4 connecting the second selection terminal pc4 and the fourth terminal p4. The fourth filter 14 is connected to the second selection terminal pc4 with the fourth signal path r4 interposed therebetween. The fourth filter 14 is preferably, for example, a reception filter whose passband is the downlink frequency band (reception band) of Band 7. The fourth filter 14 receives a reception wave input from the second selection terminal pc4, filters the reception wave in the passband of Band 7, and outputs the filtered wave to the fourth terminal p4. The passband of the fourth filter 14 is higher than the passband of the first filter 11.

Also in the multiplexer 1F according to the third preferred embodiment, on the first signal path r1, a distance connecting the common connection point nc and the inductor L1 is shorter than a distance connecting the inductor L1 and the first filter 11. That is, on the first signal path r1, the length of the first wiring line ra connecting the common connection point nc and the inductor L1 is shorter than the second wiring line rb connecting the inductor L1 and the first filter 11. Accordingly, a stray capacitance generated on a path between the common connection point nc and the inductor L1 is reduced, thus reducing or preventing deterioration of the characteristics of the multiplexer 1F.

Here, in order to describe the advantageous effects of the third preferred embodiment, a multiplexer of the third preferred embodiment and a multiplexer of a comparative example will be described by way of example with reference to FIGS. 14 and 15. In the following example, the multiplexer according to the third preferred embodiment is structured such that the length of the first wiring line ra is about 0.5 mm and the length of the second wiring line rb is about 1.5 mm (ra<rb), and the multiplexer of the comparative example structured that the length of the first wiring line ra is about 1.5 mm and the length of the second wiring line rb is about 0.5 mm (ra>rb). Note that FIGS. 14 and 15 discussed below assume a state in which the switch common terminal pcc is simultaneously connected to the first selection terminal pc1 and to the second selection terminal pc4, that is, the case in which carrier aggregation is executed.

Figure 14:
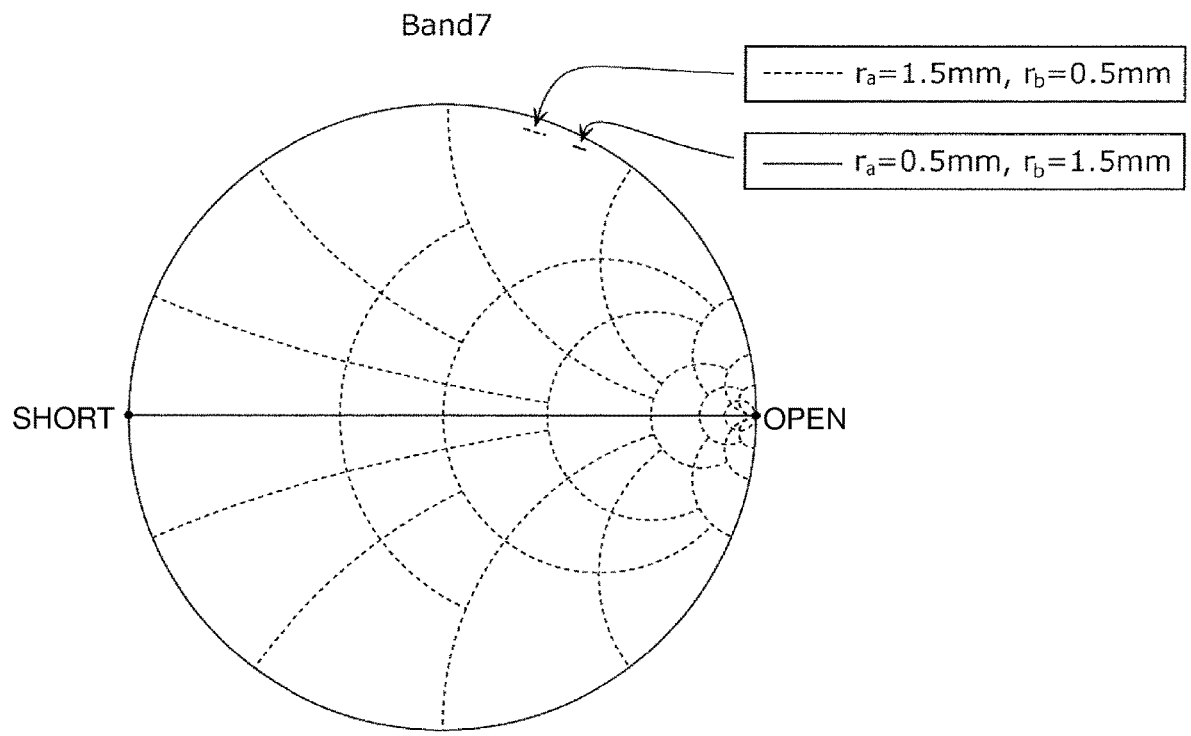
FIG. 14 is a Smith chart illustrating impedance in Band 7 in the case in which the first filter alone is viewed from the common connection point in the third preferred embodiment of the present invention.

FIG. 14 is a Smith chart illustrating impedance in Band 7 in the case in which the first filter 11 alone is viewed from the common connection point nc. As illustrated in FIG. 14, the impedance of the third preferred embodiment in Band 7 (solid line) is positioned closer to open than the impedance of the comparative example (broken line). Therefore, the first filter 11 of the third preferred embodiment is able to increase the amount of attenuation in Band 7, which is a partner band, compared with the comparative example.

Figure 15:
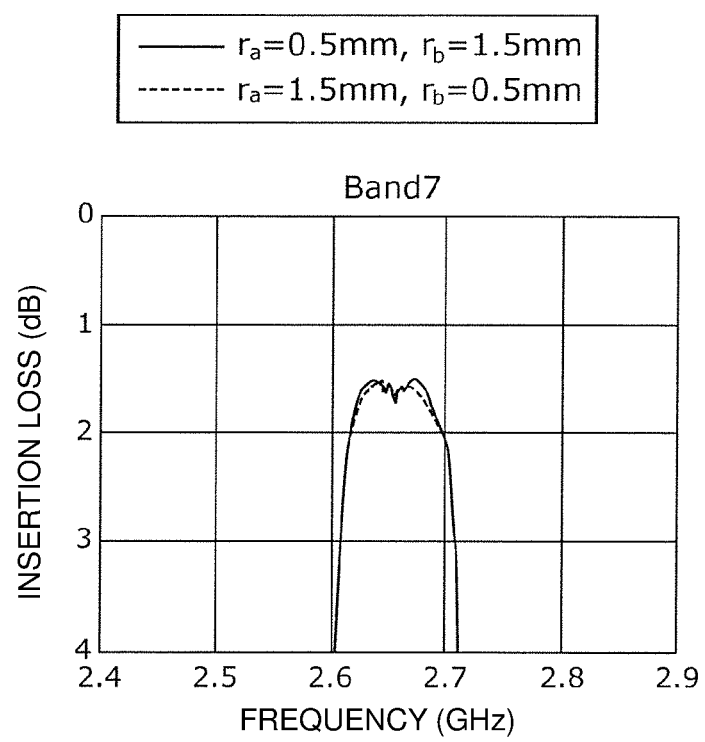
FIG. 15 is a diagram illustrating bandpass characteristics in Band 7 between the common terminal and a fourth terminal of the multiplexer according to the third preferred embodiment of the present invention.

FIG. 15 is a diagram illustrating bandpass characteristics in Band 7 between the first selection terminal pc1 and the fourth terminal p4 of the multiplexer 1F. In FIG. 15, when the bandpass characteristics of the third preferred embodiment (solid line) and the bandpass characteristics of the comparative example (broken line) in Band 7 are compared with each other, the insertion loss is smaller in the third preferred embodiment than in the comparative example. That is, as illustrated in FIG. 14, the impedance in Band 7, which is a partner band of the first filter 11, is closer to open. Therefore, as illustrated in FIG. 15, the multiplexer 1F of the third preferred embodiment is able to reduce or prevent an increase in insertion loss in Band 7, which is the passband of the fourth filter 14, for an RF signal passing through the fourth filter 14.

That is, in the multiplexer 1F, on the first signal path r1, a distance connecting the common connection point nc and the inductor L1 is shorter than a distance connecting the inductor L1 and the first filter 11. Thus, deterioration of the characteristics of the multiplexer 1F is able to be reduced or prevented even in the case in which carrier aggregation including Band 3 and Band 7 is executed.

Fourth Preferred Embodiment

The multiplexers 1 to 1F according to the above-described preferred embodiments and modifications thereof are also applicable to a communication apparatus 9.

Figure 16:
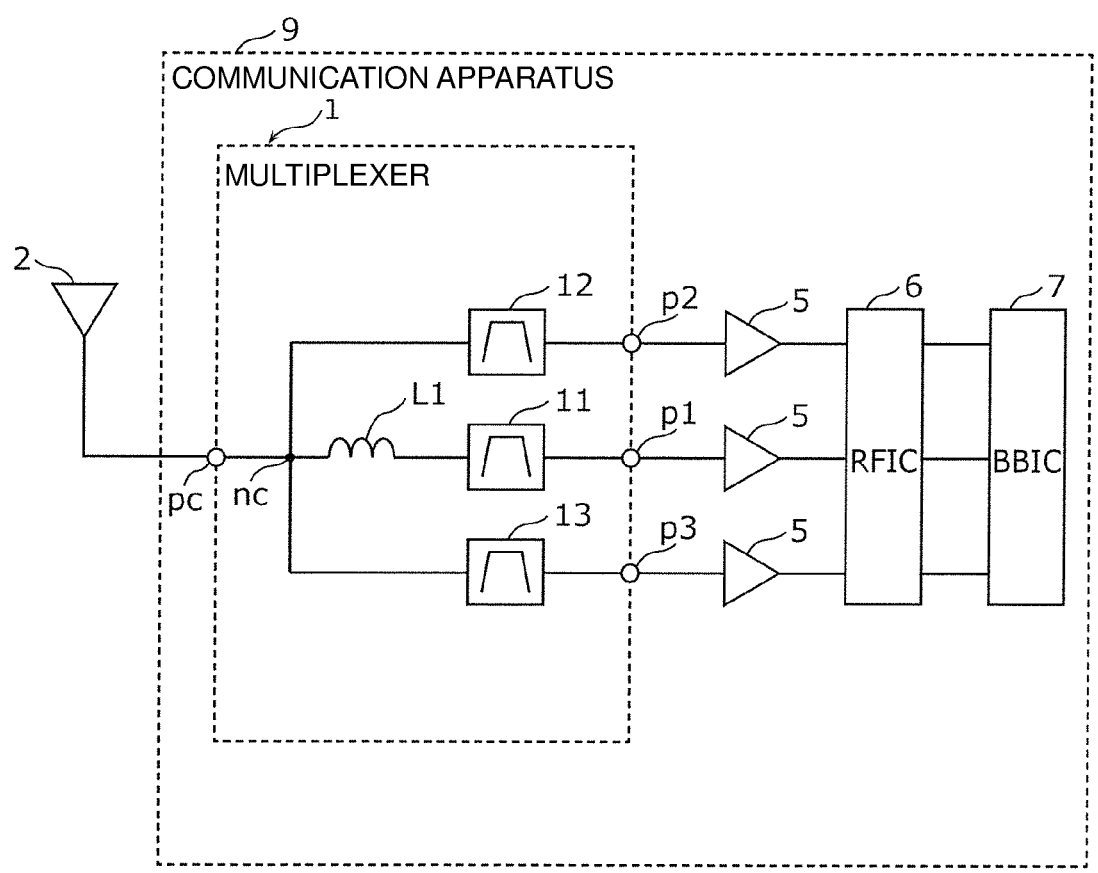
FIG. 16 is a circuit configuration diagram of a communication apparatus according to a fourth preferred embodiment of the present invention.

FIG. 16 is a circuit configuration diagram of a communication apparatus 9 according to a fourth preferred embodiment of the present invention. Note that FIG. 16 also illustrates the antenna element 2, which is connected to the communication apparatus 9.

The communication apparatus 9 includes the multiplexer 1 according to the first preferred embodiment, a plurality of amplifier circuits 5, an RF signal processing circuit (RFIC) 6, and a baseband signal processing circuit (BBIC) 7.

Each of the amplifier circuits 5 is a low-noise amplifier that amplifies an RF signal (here, an RF reception signal) having passed through the antenna element 2 and the multiplexer 1, and outputs the amplified signal to the RF signal processing circuit 6.

The RF signal processing circuit 6 performs signal processing on an RF reception signal input from the antenna element 2 via a reception signal path by, for example, down-converting the RF reception signal, and outputs a reception signal generated by the signal processing to the baseband signal processing circuit 7. A signal processed by the baseband signal processing circuit 7 is used as, for example, an image signal for displaying an image, or an audio signal for conversation.

According to the communication apparatus 9 with the above-described configuration, because the communication apparatus 9 includes the multiplexer 1 according to the first preferred embodiment, deterioration of the characteristics of the multiplexer 1 is able to be reduced or prevented, and degradation of the communication performance of the communication apparatus 9 is able to be reduced or prevented.

Note that the communication apparatus 9 may include the multiplexer 1A to 1F, instead of the multiplexer 1.

Although multiplexers and communication apparatuses according to preferred embodiments of the present invention have been described above, the present invention includes other preferred embodiments obtained by combining arbitrary elements in the above-described preferred embodiments and modifications thereof, modifications achieved by applying various modifications conceivable to those skilled in the art to the above-described preferred embodiments without departing from the gist of the present invention, and various devices including the multiplexer or the communication apparatus according to preferred embodiments of the present invention.

For example, although the second filter 12 is set to Band 1 and the third filter 13 is set to Band 40 in the above-described first preferred embodiment, conversely, the second filter 12 may be set to Band 40 and the third filter 13 may be set to Band 1.

In addition, although an example in which the inductor L1 that provides phase adjustment is connected to a Band-3 filter whose passband is lowest among the three filters has been discussed in the above-described first preferred embodiment, a filter to which the inductor L1 is connected is not limited to that filter.

For example, a filter connecting the inductor L1 may be a Band-1 filter whose passband is second lowest. In that case, a filter with the passband of Band 1 may be referred to as a first filter, and a filter with the passband of Band 40 may be referred to as a second filter. That is, it is sufficient if there is at least one filter whose passband is higher than a filter connecting the inductor L1, among a plurality of filters connected to the common connection point nc.

Furthermore, a filter connecting the inductor L1 may be, for example, the second filter 12 or the third filter 13. That is, a filter connecting the inductor L1 may be, among a plurality of filters connected to the common connection point nc, a filter with the highest passband, or another filter excluding both a filter with the highest passband and a filter with the lowest passband.

For example, although a multiplexer including three filters has been discussed for example in the above-described first preferred embodiment, the present invention is also applicable to, for example, a quadplexer including four filters or a hexaplexer including six filters. In other words, it is sufficient for the multiplexer to include two or more filters.

Although an example in which all of the three filters are reception filters has been described in the above-described first preferred embodiment, filters included in the multiplexer 1 are not limited to reception filters. For example, some of the filters included in the multiplexer 1 may be transmission filters, or all of the filters may be transmission filters.

Preferred embodiments of the present invention may be widely used as a multiplexer and a communication apparatus applicable to a multiband system in a communication device, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
    a first filter disposed on a first signal path;
    a second filter disposed on a second signal path different from the first signal path, the second filter having a passband different from that of the first filter;
    a common connection point at which the first signal path and the second signal path are connected to each other; and
    an inductor disposed in series on a path connecting the common connection point and the first filter, the path being a portion of the first signal path; wherein
    on the first signal path, a distance of a portion connecting the common connection point and the inductor is shorter than a distance of a portion connecting the inductor and the first filter.

2. The multiplexer according to claim 1, wherein
    on the first signal path, the common connection point and the inductor are connected by a first wiring line, and the inductor and the first filter are connected by a second wiring line; and
    a length of the first wiring line is shorter than a length of the second wiring line.

3. The multiplexer according to claim 1, wherein the inductor includes a coil-shaped or substantially coil-shaped conductor.

4. The multiplexer according to claim 1, wherein a distance connecting the common connection point and the first filter on the first signal path is longer than a distance connecting the common connection point and the second filter on the second signal path.

5. The multiplexer according to claim 1, wherein the first filter has a passband lower than that of the second filter.

6. The multiplexer according to claim 1, further comprising:
    a third filter disposed on a third signal path different from each of the first signal path and the second signal path; wherein
    the third signal path is connected to the common connection point; and
    the third filter has a passband higher than that of the first filter.

7. The multiplexer according to claim 6, wherein
    each of the first filter, the second filter, and the third filter is a reception filter; and
    the passband of the first filter is Band 3 of 3GPP, the passband of the second filter is Band 1 of 3GPP, and the passband of the third filter is Band 40 of 3GPP.

8. The multiplexer according to claim 1, further comprising:
    a switch including a switch common terminal and a plurality of selection terminals; and
    a fourth filter connected to a first selection terminal among the plurality of selection terminals, the fourth filter having a passband different from that of the first filter and the second filter; wherein
    the common connection point is connected to a second selection terminal different from the first selection terminal among the plurality of selection terminals.

9. The multiplexer according to claim 8, wherein the switch includes one or more switch elements that simultaneously connect the switch common terminal and the first selection terminal, and the switch common terminal and the second selection terminal.

10. The multiplexer according to claim 8, wherein the passband of the fourth filter is Band 7 of 3GPP.

11. A communication apparatus comprising:
    the multiplexer according to claim 1; and
    a signal processing circuit.

12. The communication apparatus according to claim 11, wherein
on the first signal path, the common connection point and the inductor are connected by a first wiring line, and the inductor and the first filter are connected by a second wiring line; and
a length of the first wiring line is shorter than a length of the second wiring line.

13. The communication apparatus according to claim 11, wherein the inductor includes a coil-shaped or substantially coil-shaped conductor.

14. The communication apparatus according to claim 11, wherein a distance connecting the common connection point and the first filter on the first signal path is longer than a distance connecting the common connection point and the second filter on the second signal path.

15. The communication apparatus according to claim 11, wherein the first filter has a passband lower than that of the second filter.

16. The communication apparatus according to claim 11, further comprising:
a third filter disposed on a third signal path different from each of the first signal path and the second signal path; wherein
the third signal path is connected to the common connection point; and
the third filter has a passband higher than that of the first filter.

17. The communication apparatus according to claim 16, wherein
each of the first filter, the second filter, and the third filter is a reception filter; and
the passband of the first filter is Band 3 of 3GPP, the passband of the second filter is Band 1 of 3GPP, and the passband of the third filter is Band 40 of 3GPP.

18. The communication apparatus according to claim 11, further comprising:
a switch including a switch common terminal and a plurality of selection terminals; and
a fourth filter connected to a first selection terminal among the plurality of selection terminals, the fourth filter having a passband different from that of the first filter and the second filter; wherein
the common connection point is connected to a second selection terminal different from the first selection terminal among the plurality of selection terminals.

19. The communication apparatus according to claim 18, wherein the switch includes one or more switch elements that simultaneously connect the switch common terminal and the first selection terminal, and the switch common terminal and the second selection terminal.

20. The communication apparatus according to claim 18, wherein the passband of the fourth filter is Band 7 of 3GPP.

* * * * *